(12) United States Patent
Shi et al.

(10) Patent No.: US 10,270,351 B1
(45) Date of Patent: Apr. 23, 2019

(54) EMI-RADIATION SUPPRESSION CIRCUIT

(71) Applicant: ASIAN POWER DEVICES INC., Taoyuan (TW)

(72) Inventors: Kai-Yuan Shi, Guangdong (CN); Hai-Ping Ding, Guangdong (CN)

(73) Assignee: ASIAN POWER DEVICES INC., Taoyuan (TW)

( * ) Notice: Subject to any disclaimer, the term of this patent is extended or adjusted under 35 U.S.C. 154(b) by 0 days.

(21) Appl. No.: 15/920,891

(22) Filed: Mar. 14, 2018

(30) Foreign Application Priority Data

Jan. 19, 2018 (TW) .............................. 107102121 A

(51) Int. Cl.
   *H02M 3/335* (2006.01)

(52) U.S. Cl.
   CPC .... *H02M 3/33523* (2013.01); *H02M 3/33561* (2013.01)

(58) Field of Classification Search
   CPC ............................................ H02M 3/335–3/42
   See application file for complete search history.

(56) References Cited

U.S. PATENT DOCUMENTS

| | | | | |
|---|---|---|---|---|
| 5,521,838 A * | 5/1996 | Rosendahl | ................ | H02J 3/14 307/35 |
| 2008/0136373 A1* | 6/2008 | Lai | ........................ | H02J 7/0047 320/128 |

FOREIGN PATENT DOCUMENTS

| | | |
|---|---|---|
| CN | 101964586 A | 2/2011 |
| CN | 206149134 U | 5/2017 |
| TW | 201318323 A | 5/2013 |
| TW | M488805 U | 10/2014 |
| TW | 201640767 A | 11/2016 |

* cited by examiner

*Primary Examiner* — Kyle J Moody
*Assistant Examiner* — Peter M Novak
(74) *Attorney, Agent, or Firm* — Muncy, Geissler, Olds & Lowe, P.C.

(57) ABSTRACT

An EMI-radiation suppression circuit is applied to a power converter having a main power switch. The EMI-radiation suppression circuit includes a control unit, a drive selection unit, and a switch unit. The drive selection unit is coupled between the control unit and the main power switch, and which provides at least two drive terminals. One drive terminal is coupled to the control unit and another drive terminal is coupled to the main power switch. The switch unit is coupled between one of the at least two drive terminals and a ground to receive a feedback control signal. When the feedback control signal activates the switch unit, the ground is coupled to the drive terminal to which the switch unit is coupled. Grounding the gate terminal suppresses the EMI and maintains operational efficiency of the power converter.

8 Claims, 5 Drawing Sheets

EMI-RADIATION SUPPRESSION CIRCUIT

BACKGROUND OF THE INVENTION

Technical Field

The present disclosure relates to an EMI-radiation suppression circuit, and more particularly to an EMI-radiation suppression circuit which is applied to a power converter.

Description of Related Art

With the increasing requirements for miniaturization of power converters, the higher switch frequency of the power converter is needed and therefore to promote the development of the entire power supply industry. The largest problem with high frequency operation is electromagnetic interference (EMI). Since the EMI damages electronic components or electronic devices through electromagnetic conduction and/or electromagnetic radiation, it is an urgent task for personnel who develop and design switching power supplies to mitigate EMI.

SUMMARY OF THE INVENTION

An objective of the present disclosure is to provide an EMI-radiation suppression circuit to solve the above-mentioned EMI problems due to high-frequency operation of power converters.

In order to achieve the above-mentioned objective, the EMI-radiation suppression circuit is applied to a power converter having a main power switch. The EMI-radiation suppression circuit includes a control unit, a drive selection unit, and a switch unit. The drive selection unit is coupled between the control unit and the main power switch, and the drive selection unit provides at least two drive terminals. A first drive terminal of the at least two drive terminals is coupled to the control unit and a second drive terminal of the at least two drive terminals is coupled to the main power switch. The switch unit is coupled between one of the at least two drive terminals and a ground, and receives a feedback control signal. The ground is coupled to the drive terminal to which the switch unit is coupled when the feedback control signal activates the switch unit.

Accordingly, the disclosed EMI-radiation suppression circuit is to achieve both the EMI-radiation suppression and high-efficiency operation of the power converter, and achieve the EMI-radiation suppression in different degrees and the flexible circuit adjustment.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
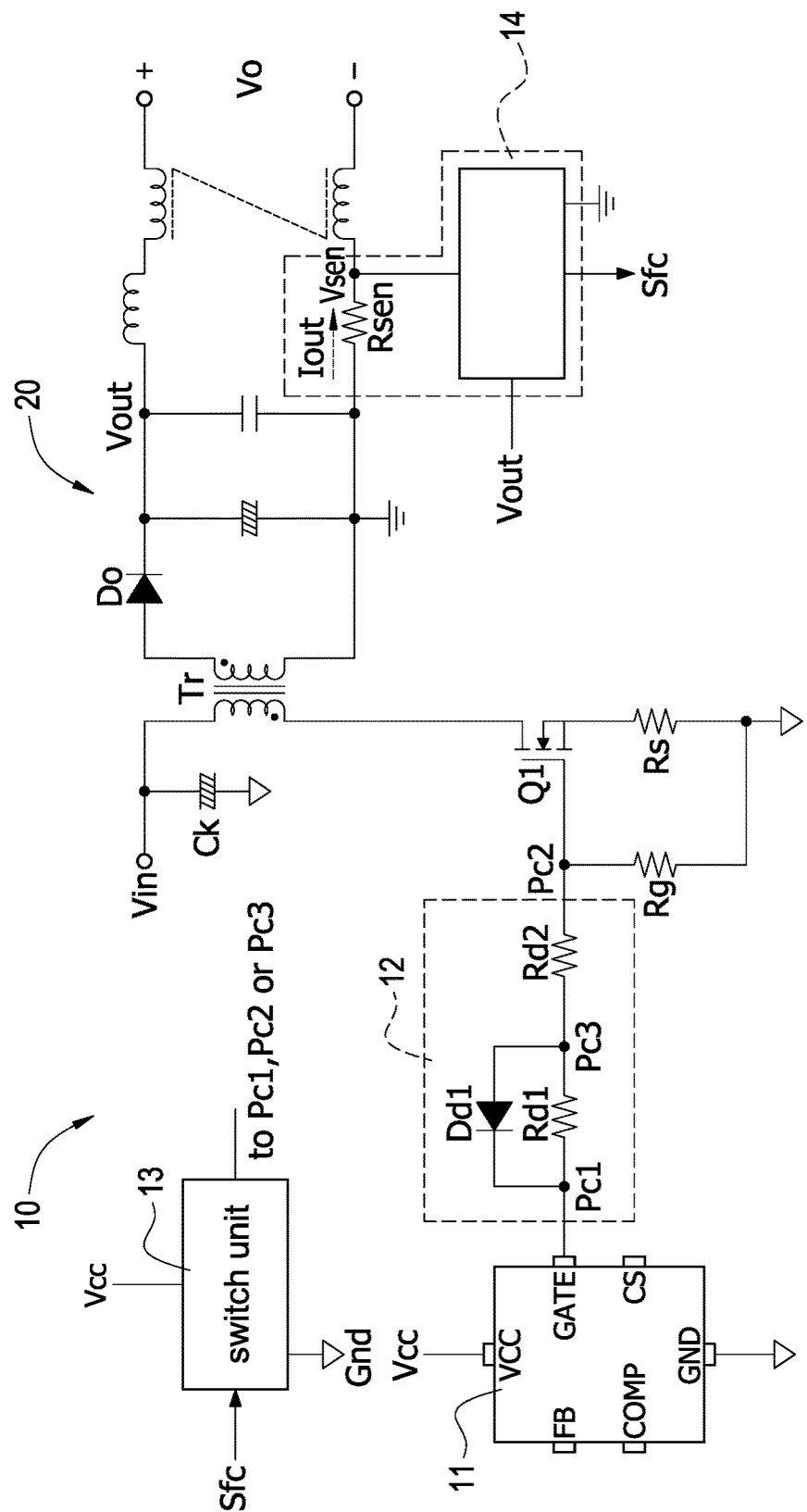
FIG. 1 is a block circuit diagram of an EMI-radiation suppression circuit according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block circuit diagram of an EMI-radiation suppression circuit according to the present disclosure. The EMI-radiation suppression circuit 10 is applied to a power converter 20. In one embodiment, the power converter 20 is, for example but not limited to, a flyback converter. The power converter 20 has a transformer Tr with a primary side and a secondary side, and the transformer Tr receives an input voltage value Vin at the primary side thereof. The input voltage value Vin shown in FIG. 1 is simplified to represent a front-end AC-to-DC conversion, and the input voltage value Vin is provided across a bulk capacitor Ck. The primary side of the transformer Tr is coupled to a main power switch Q1, and the transformer Tr provides an electrical energy from the primary side to the secondary side by switching the main power switch Q1 by a control unit 11.

The EMI-radiation suppression circuit 10 includes the control unit 11, a drive selection unit 12, and a switch unit 13. In one embodiment, the control unit 11 is, for example but not limited to, a pulse width modulation (PWM) IC. The control unit 11 outputs a control signal through a pin, such as a GATE pin shown in FIG. 1 to switch the main power switch Q1 through the drive selection unit 12.

The drive selection unit 12 is coupled between the control unit 11 and the main power switch Q1 of the power converter 20 to provide at least two drive terminals. One of the at least two drive terminals is a first drive terminal Pc1, and the first drive terminal Pc1 is coupled to the control unit 11, namely is coupled to the GATE pin of the control unit 11. Another one of the at least two drive terminals is a second drive terminal Pc2, and the second drive terminal Pc2 is coupled to the main power switch Q1, namely is coupled to a control end of the main power switch Q1. Take a MOSFET as the main power switch Q1 for example, the second drive terminal Pc2 is coupled to a gate of the main power switch Q1. In this embodiment, the first drive terminal Pc1 is adjacent to the control unit 11 comparing to the second drive terminal Pc2, i.e., the second drive terminal Pc2 is adjacent to the main power switch Q1 comparing to the first drive terminal Pc1. In one embodiment as shown in FIG. 1, the number of the drive terminals is three, namely a third drive terminal Pc3 is further provided besides the first drive terminal Pc1 and the second drive terminal Pc2.

The switch unit 13 is coupled between any one of the at least two drive terminals Pc1, Pc2, Pc3 and a ground Gnd. In particular, an output of the switch unit 13 may be coupled to one of the first drive terminal Pc1, the second drive terminal Pc2, and the third drive terminal Pc3. In addition, the switch unit 13 may be directly coupled to one of the first drive terminal Pc1, the second drive terminal Pc2, and the third drive terminal Pc3, or indirectly coupled to one of the first drive terminal Pc1, the second drive terminal Pc2, and the third drive terminal Pc3 by a switching switch (not shown) for switching or selecting which drive terminal is coupled to the switch unit 13. In the circuit topology, the ground Gnd is a ground at the primary side of the transformer Tr of the power converter 20 comparing to a ground at the secondary side of the transformer Tr.

The switch unit 13 receives a feedback control signal Sfc which is provided from the secondary side of the power converter 20 for controlling the switch unit 13. When the feedback control signal Sfc activates the switch unit 13, the ground Gnd is coupled to one of the first drive terminal Pc1, the second drive terminal Pc2, and the third drive terminal Pc3 to which the switch unit 13 is coupled. For example, when the switch unit 13 is coupled to the first drive terminal Pc1 and the feedback control signal Sfc activates the switch unit 13, the ground Gnd is coupled to the first drive terminal Pc1. Similarly, when the switch unit 13 is coupled to the second drive terminal Pc2 and the feedback control signal Sfc activates the switch unit 13, the ground Gnd is coupled to the second drive terminal Pc2.

As shown in FIG. 1, the EMI-radiation suppression circuit 10 further includes a sampling unit 14. The sampling unit 14 is coupled to an output side of the power converter 20 for sampling an output current value Iout and/or an output voltage value Vout of the power converter 20. The output current value Tout flowing through a sense resistor Rsen is converted to a sense voltage value Vsen which is proportional to the output current value Tout, namely Vsen=Iout× Rsen. Therefore, the loading condition, such as a light load, a heavy load, a full load, or an over load of the power converter 20 may be determined according to the converted sense voltage value Vsen.

It is assumed that the load condition is over full load to make the feedback control signal Sfc activate the switch unit 13. The sampling unit 14 determines whether the power converter 20 is in the over full-load condition by comparing the output current value Tout to a predetermined threshold current range value Ith. In one embodiment, the threshold current range value Ith is greater than a full-load current value Ifull of the power converter 20 and less than an over-load protective current value IOLP of the power converter 20, namely $I_{OLP}$>Ith>Ifull. Accordingly, it means that the output current value Tout is greater than the full-load current value Ifull when the sampling unit 14 detects that the output current value Tout is greater than the threshold current range value Ith, therefore to confirm that the power converter 20 is in the over full-load condition.

At this condition, the output current value Tout is within the threshold current range value Ith, and the sampling unit 14 transmits the feedback control signal Sfc to the switch unit 13 to activate the switch unit 13 so that the ground Gnd is coupled to the drive terminal Pc1, Pc2, Pc3 to which the switch unit 13 is coupled. Accordingly, the switch unit 13 is activated to effectively suppress the EMI radiation when the power converter 20 is between the over full-load condition and the over-load protective current condition.

As shown in FIG. 1, the drive selection unit 12 includes a first diode Dd1, a first resistor Rd1, and a second resistor Rd2. The first resistor Rd1 is coupled in parallel to the first resistor Rd1 to provide a first end and a common connected end, and the first end is the first drive terminal Pc1 to which the GATE pin of the control unit 11 is coupled. The second resistor Rd2 provides a second end and the common connected end, and the second end is the second drive terminal Pc2 to which the main power switch Q1 is coupled. The common connected end is an end to which the first resistor Rd1, the first diode Dd1, and the second resistor Rd2 are commonly connected. In this embodiment, the common connected end is the third drive terminal Pc3.

Please refer to FIG. 1, which shows a circuit diagram of a switch unit of the EMI-radiation suppression circuit according to a first embodiment of the present disclosure. The switch unit 13 mainly includes a receiver switch 131, a voltage-dividing resistor assembly 132, a voltage control part 133, and an output part 134. The receiver switch 131 receives a power voltage Vcc shown in FIG. 1, and the power voltage Vcc is used to provide the required power of operating the EMI-radiation suppression circuit 10. Also, the power voltage Vcc is a high (voltage) level of a control signal provided by the control unit 11, comparing to the ground potential or negative voltage.

The voltage-dividing resistor assembly 132 is coupled between the receiver switch 131 and the ground Gnd, and the voltage-dividing resistor assembly 132 includes a first voltage-dividing resistor Rx1 and a second voltage-dividing resistor Rx2. The power voltage Vcc is divided by a resistance ratio between the first voltage-dividing resistor Rx1 and the second voltage-dividing resistor Rx2 so that a voltage-dividing voltage Vx is provided across two ends of the second voltage-dividing resistor Rx2.

The voltage control part 133 receives the voltage-dividing voltage Vx across two ends of the second voltage-dividing resistor Rx2. The voltage control part 133 includes an auxiliary power switch Qx and a voltage-regulating component assembly 133', i.e., the voltage-regulating component assembly 133' includes other components in the voltage control part 133 other than the auxiliary power switch Qx. The voltage-regulating component assembly 133' is coupled to the auxiliary power switch Qx and receives the voltage-dividing voltage Vx. More specifically, the voltage-regulating component assembly 133' mainly includes a first capacitor Cx1, a second diode Dx2, a third resistor Rx3, and a fourth resistor Rx4. The first capacitor Cx1 is coupled between the auxiliary power switch Qx and the ground Gnd. The third resistor Rx3 is coupled in parallel to the second diode Dx2, and coupled to the first capacitor Cx1 and the auxiliary power switch Qx. The fourth resistor Rx4 is coupled between the third resistor Rx3 and the voltage-dividing resistor assembly 132.

Figure 2:
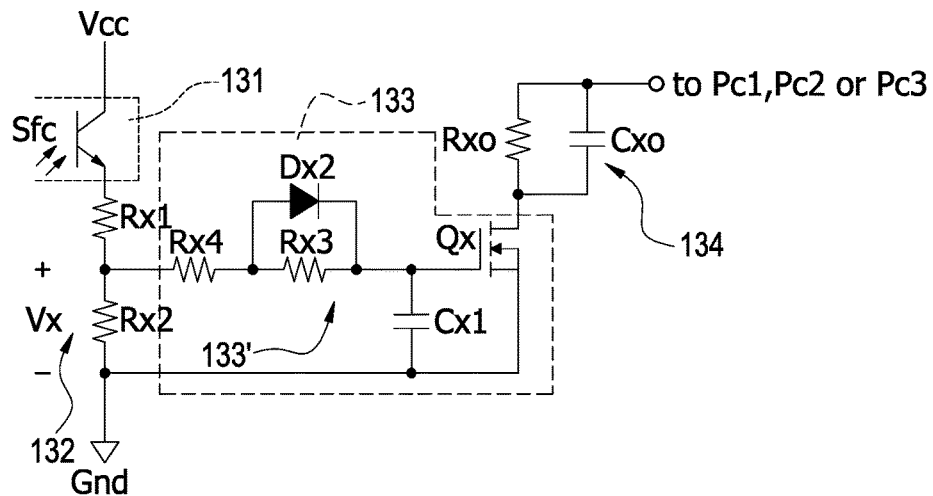
FIG. 2 is a circuit diagram of a switch unit of the EMI-radiation suppression circuit according to a first embodiment of the present disclosure.

The output part 134 is coupled to the voltage control part 133. As shown in FIG. 2, the output part 134 includes an output resistor Rxo and an output capacitor Cxo coupled in parallel to the output resistor Rxo.

When the voltage control part 133 is turned on, the ground Gnd is coupled to the drive terminal Pc1, Pc2, Pc3 to which the switch unit 13 is coupled through the output part 134. More specifically, the voltage-dividing voltage Vx turns on the auxiliary power switch Qx through the voltage-regulating component assembly 133' so that the ground Gnd is coupled to the drive terminal Pc1, Pc2, Pc3 to which the switch unit 13 is coupled through the output part 134 when the feedback control signal Sfc activates the switch unit 13.

Figure 3:
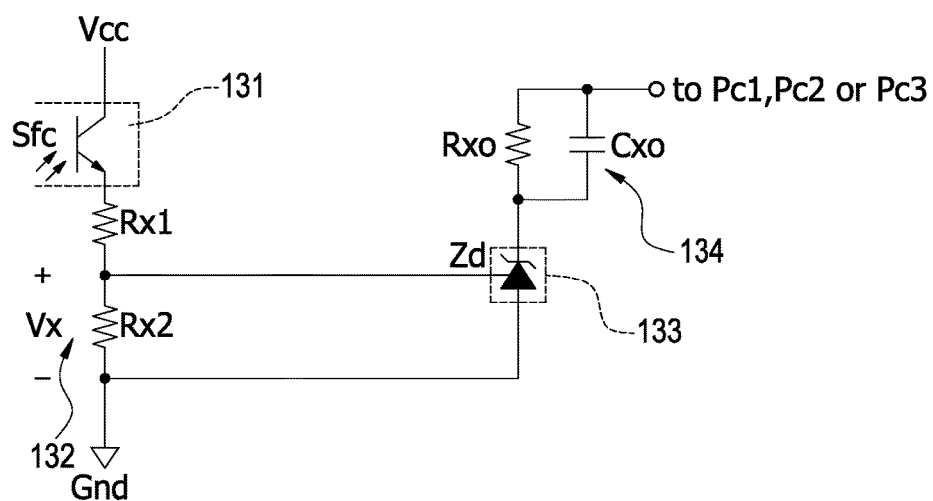
FIG. 3 is a circuit diagram of the switch unit of the EMI-radiation suppression circuit according to a second embodiment of the present disclosure.

Please refer to FIG. 3, which shows a circuit diagram of the switch unit of the EMI-radiation suppression circuit according to a second embodiment of the present disclosure. It is different from the voltage control part 133 including the auxiliary power switch Qx and the voltage-regulating component assembly 133' shown in FIG. 2, the voltage control part 133 shown in FIG. 3 is a voltage-regulating transistor Zd. The voltage-regulating transistor Zd has a control end (reference R), a first connection end (anode A), and a second connection end (cathode K). The control end is coupled to a high-voltage side of the voltage-dividing voltage Vx, namely a non-ground side of the second voltage-dividing resistor Rx2 and also an end to which the first voltage-dividing resistor Rx1 and the second voltage-dividing resistor Rx2 are commonly connected. The first connection end is coupled to the ground Gnd, and the second connection end is coupled to the output resistor Rxo and the output capacitor Cxo of the output part 134.

When the voltage control part 133 is turned on, the ground Gnd is coupled to the drive terminal Pc1, Pc2, Pc3 to which the switch unit 13 is coupled through the output part 134. More specifically, the voltage-dividing voltage Vx turns on the voltage-regulating transistor Zd so that the ground Gnd is coupled to the drive terminal Pc1, Pc2, Pc3 to which the switch unit 13 is coupled through the output part 134 when the feedback control signal Sfc activates the switch unit 13.

Figure 4:
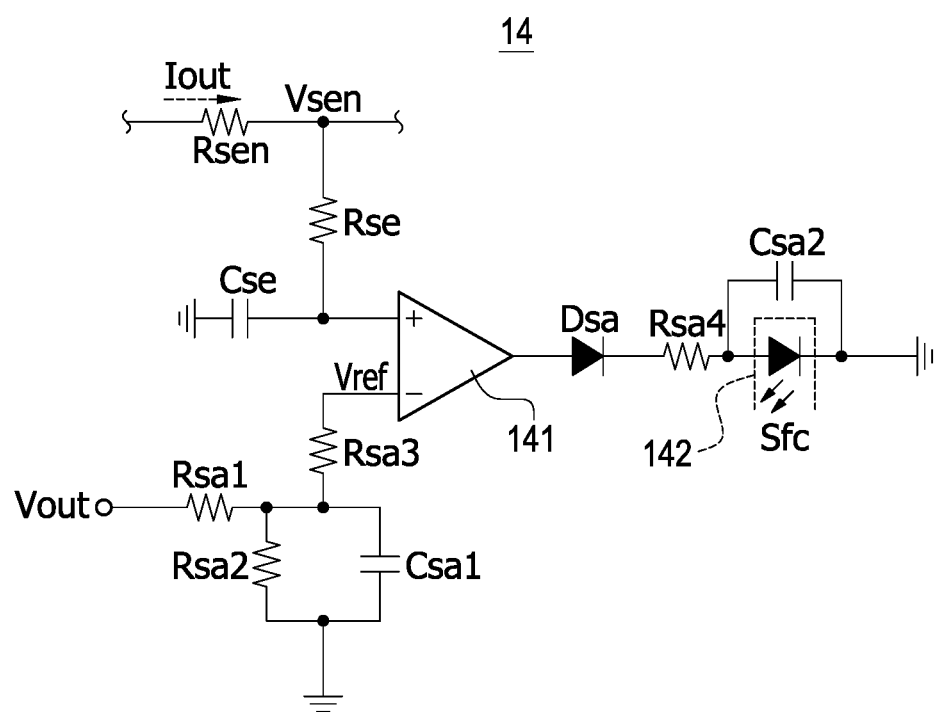
FIG. 4 is a circuit diagram of a sampling unit of the EMI-radiation suppression circuit according to the present disclosure.

Please refer to FIG. 4, which shows a circuit diagram of a sampling unit of the EMI-radiation suppression circuit according to the present disclosure. The sampling unit 14 mainly includes a comparator 141 and a transmitter switch 142. In this embodiment, the comparator 141 is an operational amplifier with a function of voltage compensation. A non-inverting input end of the comparator 141 is coupled to a resistor Rse, and the comparator 141 receives the sense voltage value Vsen through the resistor Rse.

An inverting input end of the comparator 141 receives a reference voltage value Vref. In this embodiment, since the sampling unit 14 is used to determine whether the power converter 20 is in the over full-load condition, the reference voltage value Vref may be set to correspond to the full-load current value Ifull. When the output current value Iout is greater than the full-load current value Ifull, it means that the power converter 20 is in the over full-load condition. Correspondingly, when the sense voltage value Vsen, which is converted by the output current value Iout flowing through the sense resistor Rsen shown in FIG. 1, is greater than the reference voltage value Vref, it means that the output current value Iout is greater than the full-load current value Ifull. Therefore, when the power converter 20 is between the over full-load condition and the over-load protective current condition, the feedback control signal Sfc outputted from the sampling unit 14 turns on the switch unit 13 to activate the EMI-radiation suppression function by the switch unit 13. A resistor-capacitor network coupled at the inverting input end of the comparator 141 receives the output voltage value Vout of the power converter 20 and converts the output voltage value Vout into the reference voltage value Vref. In one embodiment, a voltage-regulating unit (not shown) may be coupled between the resistor-capacitor network and the inverting input end of the comparator 141 to regulate the converted reference voltage value Vref at a fixed value.

The transmitter switch 142 is coupled to an output end of the comparator 141 through a diode Dsa and a current-limiting resistor Rsa4. As shown in FIG. 2 or FIG. 3, the transmitter switch 142 of the sampling unit 14 and the receiver switch 131 of the switch unit 13 may be a transmitter and a receiver of a photo coupler, respectively. The photo coupler is used for a signal communication of the feedback control signal Sfc between the transmitter switch 142 (transmitter) and the receiver switch 131 (receiver) as well as an electrical isolation between the primary side and the secondary side of the transformer Tr with different grounds. Therefore, when the sense voltage value Vsen received by the comparator 141 is greater than the reference voltage value Vref, the transmitter switch 142 is turned on and transmits the feedback control signal Sfc to turn on the switch unit 13.

Figure 5:
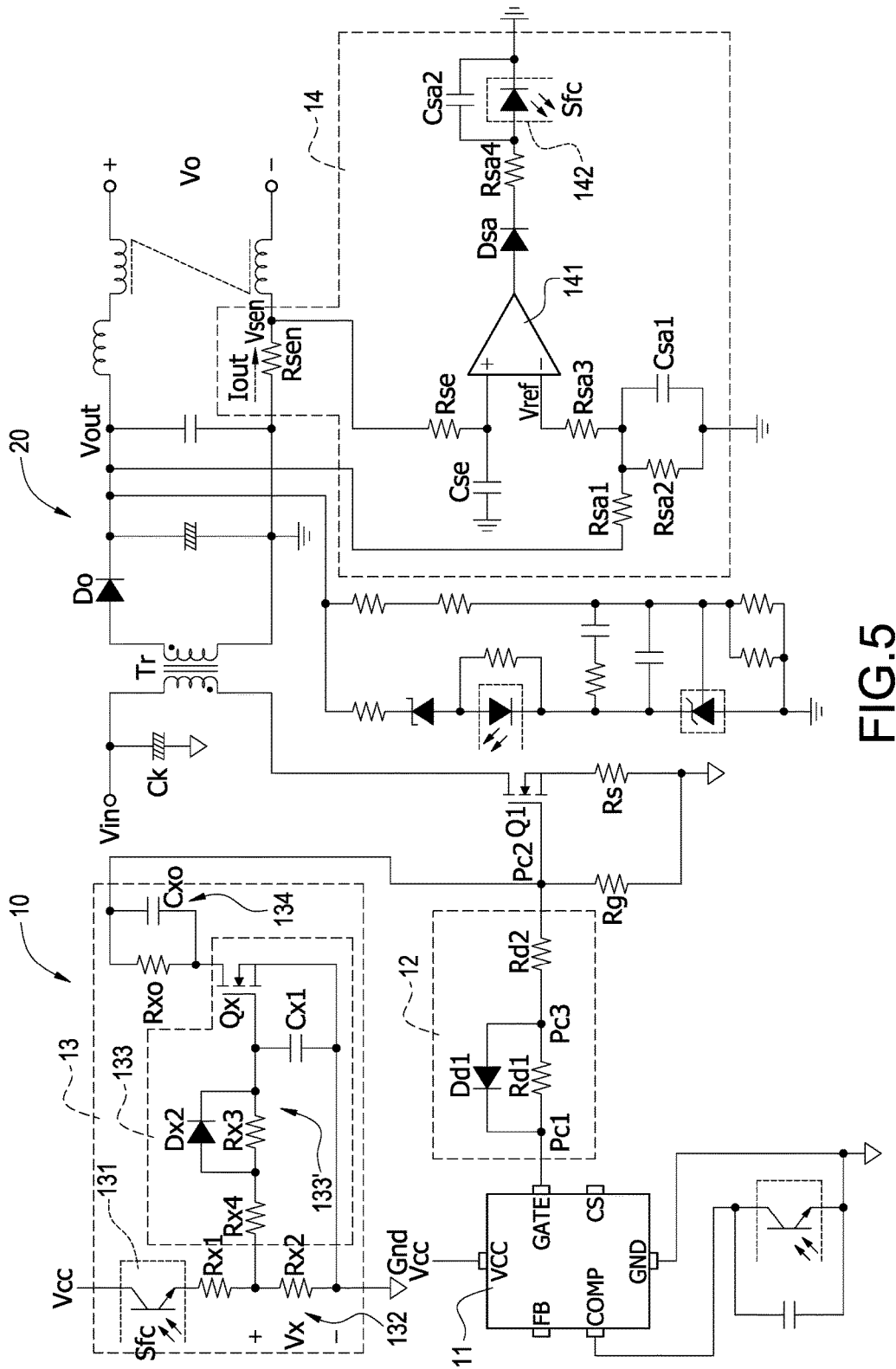
FIG. 5 is a complete circuit diagram of the EMI-radiation suppression circuit applied to a power converter according to present disclosure.

Please refer to FIG. 5, which shows a complete circuit diagram of the EMI-radiation suppression circuit applied to the power converter according to present disclosure. In this embodiment, the switch unit 13 shown in FIG. 2 is exemplified and the output, namely the output part 134 of the switch unit 13 is, but not limited to, coupled to the second drive terminal Pc2 of the drive selection unit 12. Whether the switch unit 13 is coupled to the second drive terminal Pc2, the third drive terminal Pc3, or even the first drive terminal Pc1 of the drive selection unit 12, the EMI-radiation suppression can be achieved only in different degrees.

As mentioned above, when the sampling unit 14 determines that the sampled output current value Iout of the power converter 20 is greater than the threshold current range value Ith, it means that the output current value Iout is greater than the full-load current value Ifull, therefore to confirm that the power converter 20 is in the over full-load condition. Correspondingly, when the output current value Iout is greater than the full-load current value Ifull, it means that the sense voltage value Vsen, which is converted by the output current value Tout flowing through the sense resistor Rsen, is greater than the reference voltage value Vref. When the sense voltage value Vsen is greater than the reference voltage value Vref, the comparator 141 provides a high-level output to forward turn on the diode Dsa and turn on the transmitter switch 142 so that the transmitter switch 142 transmits the feedback control signal Sfc to turn on the receiver switch 131 of the switch unit 13.

When the receiver switch 131 is turned on, the power voltage Vcc is divided by the voltage-dividing resistor assembly 132 to provide the voltage-dividing voltage Vx across two ends of the second voltage-dividing resistor Rx2. The second voltage-dividing resistor Rx2 forward turns on the second diode Dx2 so that a gate-source voltage VGS_Qx between a gate and a source of the auxiliary power switch Qx is large enough to turn on the auxiliary power switch Qx. Accordingly, the output resistor Rxo and the output capacitor Cxo coupled to a drain of the auxiliary power switch Qx are equivalently directly coupled to the ground Gnd. Since the output capacitor Cxo may be considered as an open circuit in the DC operation and the auxiliary power switch Qx is used as a switch other than an gain amplifier, a smaller resistance of the output resistor Rxo may be designed to make the effect of the ground Gnd being directly coupled to the second drive terminal Pc2 of the drive selection unit 12 more significant when the auxiliary power switch Qx is turned on. Similarly, the circuit operation and effect shown in FIG. 3 is identical to that shown in FIG. 2, the detail description is omitted here for conciseness.

Figure 6:
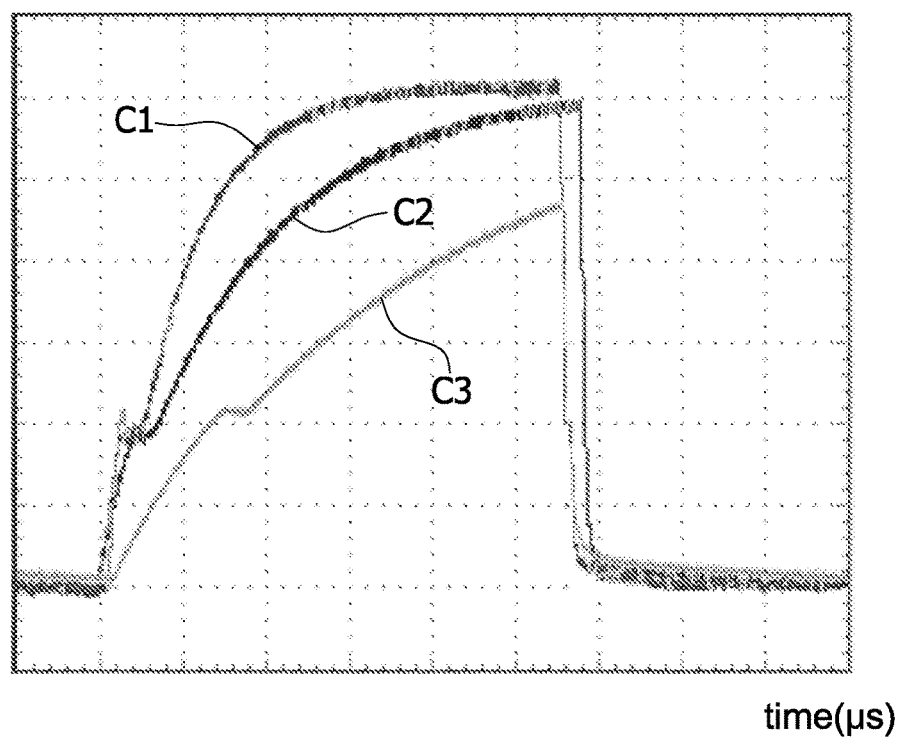
FIG. 6 is a voltage waveform of driving a main power switch according to the present disclosure.

Please refer to FIG. 6, which shows a voltage waveform of driving the main power switch according to the present disclosure. In FIG. 6, the horizontal-axis ordinate represents the time; the vertical-axis ordinate represents a drive voltage of the main power switch Q1, namely a gate-source voltage VGS_Q1 between the main power switch Q1. More specifically, FIG. 6 shows different voltage curves of driving the main power switch Q1, including a first voltage curve C1, a second voltage curve C2, and a third voltage curve C3. The first voltage curve C1 represents the voltage curve of the gate-source voltage VGS_Q1 under the absence of the EMI-radiation suppression circuit 10. It is different from the first voltage curve C1, the second voltage curve C2 and the third voltage curve C3 represent the voltage curves of the gate-source voltage VGS_Q1 under the presence of the EMI-radiation suppression circuit 10. Also, the second voltage curve C2 represents that the switch unit 13 is coupled to the first drive terminal Pc1 of the drive selection unit 12; the third voltage curve C3 represents that the switch unit 13 is coupled to the second drive terminal Pc2 of the drive selection unit 12.

Since the reduction of the drive resistance of the main power switch Q1 may make the time for turning on or turning off the main power switch Q1 be slowed down, i.e., the switch speed of the main power switch Q1 may be reduced so that the EMI radiation can be effectively suppressed by the switch unit 13. The above-mentioned "drive resistance of the main power switch Q1" means the equivalent input resistance at the gate of the main power switch Q1. As shown in FIG. 5, the equivalent input resistance is related to the first resistor Rd1 of the drive selection unit 12, the second resistor Rd2, a gate resistor Rg coupled between the gate of the main power switch Q1 and the ground Gnd, and the output resistor Rxo of the output part 134 of the switch unit 13.

More specifically, whether the switch unit 13 is coupled to the second drive terminal Pc2, the third drive terminal Pc3, or even the first drive terminal Pc1 of the drive selection unit 12, the drive resistance of the main power switch Q1 would be reduced when any one of the drive terminals Pc1, Pc2, Pc3 is coupled to the ground Gnd. In other words, since the output resistor Rxo is coupled in parallel to the original circuit, the drive resistance of the main power switch Q1 would be reduced so that the switch speed of the main power switch Q1 may be reduced to effectively suppress the EMI radiation.

Refer to FIG. 6 again, when the switch unit 13 is not activated, the drive resistance of the main power switch Q1 is the largest and the switch speed of the main power switch Q1 is the fastest, and the voltage curve of the gate-source voltage VGS_Q1 is shown as the first voltage curve C1. When the switch unit 13 is coupled to the first drive terminal Pc1 of the drive selection unit 12 and the switch unit 13 is activated, the drive resistance of the main power switch Q1 is less than the former and the switch speed of the main power switch Q1 is slowed down, and the voltage curve of the gate-source voltage VGS_Q1 is shown as the second voltage curve C2. When the switch unit 13 is coupled to the second drive terminal Pc2 of the drive selection unit 12 and the switch unit 13 is activated, the drive resistance of the main power switch Q1 is less than two of the former and the switch speed of the main power switch Q1 is further slowed down, and the voltage curve of the gate-source voltage VGS_Q1 is shown as the third voltage curve C3, and therefore, the effect of suppressing the EMI radiation is more significant. Moreover, the smaller resistance of the output resistor Rxo may be designed to make the drive resistance of the main power switch Q1 smaller, thereby significantly increasing the effect of suppressing the EMI radiation.

In conclusion, the EMI-radiation suppression circuit of the present disclosure has the following features and/or advantages:

1. When the power converter 20 is in the over full-load condition, the switch unit 13 is activated to achieve both the EMI-radiation suppression and high-efficiency operation of the power converter 20.

2. According to actual application requirements, the switch unit 13 is coupled to different drive terminals Pc1, Pc2, Pc3 to achieve the EMI-radiation suppression in different degrees and the flexible circuit adjustment.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An EMI-radiation suppression circuit applied to a power converter having a main power switch, the EMI-radiation suppression circuit comprising:
   a control unit;
   a drive selection unit coupled between the control unit and the main power switch, and the drive selection unit configured to provide at least two drive terminals; wherein a first drive terminal of the at least two drive terminals is coupled to the control unit and a second drive terminal of the at least two drive terminals is coupled to the main power switch;
   a switch unit coupled between one of the at least two drive terminals and a ground, and configured to receive a feedback control signal; and
   a sampling unit configured to sample an output current value provided from the power converter and compare the output current value to a threshold current range value,
   wherein the ground is coupled to either the first drive terminal or the second drive terminal to which the switch unit is coupled when the feedback control signal activates the switch unit, and
   wherein the sampling unit is configured to transmit the feedback control signal to the switch unit to activate the switch unit when the output current value is between the threshold current range value; wherein the threshold current range value is greater than a full-load current value of the power converter and less than an over-load protective current value of the power converter.

2. The EMI-radiation suppression circuit in claim 1, wherein the drive selection unit comprises:
   a first diode;
   a first resistor coupled in parallel to the first diode, and configured to provide a first end and a common connected end, wherein the first end is the first drive terminal; and
   a second resistor configured to provide a second end and the common connected end, wherein the second end is the second drive terminal.

3. The EMI-radiation suppression circuit in claim 1, wherein the switch unit comprises:
   a receiver switch configured to receive a power voltage;
   a voltage-dividing resistor assembly coupled between the receiver switch and the ground, and configured to divide the power voltage and provide a voltage-dividing voltage;
   a voltage control part configured to receive the voltage-dividing voltage; and
   an output part coupled to the voltage control part;
   wherein the ground is coupled to either the first drive terminal or the second drive terminal to which the switch unit is coupled through the output part when the voltage control part is turned on.

4. The EMI-radiation suppression circuit in claim 3, wherein the voltage control part is a voltage-regulating transistor, and the voltage-regulating transistor comprises a control end, a first connection end, and a second connection end; the control end is coupled to a high-voltage side of the voltage-dividing resistor assembly, the first connection end is coupled to the ground, and the second connection end is coupled to the output part;

wherein the voltage-dividing voltage turns on the voltage-regulating transistor so that the ground is coupled to either the first drive terminal or the second drive terminal to which the switch unit is coupled through the output part when the feedback control signal activates the switch unit.

5. The EMI-radiation suppression circuit in claim 3, wherein the voltage control part comprises:

an auxiliary power switch; and a voltage-regulating component assembly coupled to the auxiliary power switch, and configured to receive the voltage-dividing voltage;

wherein the voltage-dividing voltage turns on the auxiliary power switch through the voltage-regulating component assembly so that the ground is coupled to either the first drive terminal or the second drive terminal to which the switch unit is coupled through the output part when the feedback control signal activates the switch unit.

6. The EMI-radiation suppression circuit in claim 5, wherein the voltage-regulating component assembly comprises:

a first capacitor coupled between the auxiliary power switch and the ground;

a second diode;

a third resistor coupled in parallel to the second diode and coupled to the first capacitor and the auxiliary power switch; and a fourth resistor coupled between the third resistor and the voltage-dividing resistor assembly.

7. The EMI-radiation suppression circuit in claim 1, wherein the sampling unit comprises:

a comparator configured to receive a reference voltage value and a sense voltage value which corresponds to the output current value, and compare the sense voltage value to the reference voltage value; and a transmitter switch coupled to the comparator;

wherein the transmitter switch is turned on and is configured to transmit the feedback control signal to the switch unit to turn on the switch unit when the sense voltage value is greater than the reference voltage value.

8. The EMI-radiation suppression circuit in claim 7, wherein the reference voltage value is corresponding to the full-load current value.

* * * * *